United States Patent
Zhu et al.

(10) Patent No.: US 8,634,223 B2
(45) Date of Patent: *Jan. 21, 2014

(54) MAGNETIC MEMORY WITH ASYMMETRIC ENERGY BARRIER

(75) Inventors: Wenzhong Zhu, Apple Valley, MN (US); Xiaohua Lou, Bloomington, MN (US); Dimitar V. Dimitrov, Edina, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/446,458

(22) Filed: Apr. 13, 2012

(65) Prior Publication Data

US 2012/0201075 A1    Aug. 9, 2012

Related U.S. Application Data

(63) Continuation of application No. 12/497,953, filed on Jul. 6, 2009, now Pat. No. 8,169,810.

(60) Provisional application No. 61/103,742, filed on Oct. 8, 2008.

(51) Int. Cl.
*G11C 11/22* (2006.01)

(52) U.S. Cl.
USPC ............ 365/145; 365/158; 365/171; 365/173

(58) Field of Classification Search
USPC .................. 365/145, 158, 171, 173
See application file for complete search history.

(56) References Cited

U.S. PATENT DOCUMENTS

| | | |
|---|---|---|
| 4,733,371 A | 3/1988 | Terada |
| 5,191,223 A | 3/1993 | Munekata |
| 5,646,419 A | 7/1997 | McCaldin |
| 5,673,225 A | 9/1997 | Jeong |
| 5,761,115 A | 6/1998 | Kozicki |
| 5,920,446 A | 7/1999 | Gill |
| 5,982,670 A | 11/1999 | Yamashita |
| 6,072,718 A | 6/2000 | Abraham |
| 6,178,136 B1 | 1/2001 | Lin |
| 6,226,197 B1 | 5/2001 | Nishimura |
| 6,252,796 B1 | 6/2001 | Lenssen |
| 6,381,106 B1 | 4/2002 | Pinarbasi |
| 6,469,926 B1 | 10/2002 | Chen |
| 6,532,164 B2 | 3/2003 | Redon |
| 6,542,000 B1 | 4/2003 | Black |

(Continued)

FOREIGN PATENT DOCUMENTS

| | | |
|---|---|---|
| GB | 2 422 735 | 8/2006 |
| WO | 2008/100868 | 8/2008 |

OTHER PUBLICATIONS

Baek et al., Tech. Dig. IEDM (2004) 587.

(Continued)

*Primary Examiner* — Pho M Luu
(74) *Attorney, Agent, or Firm* — Mueting Raasch & Gebhardt

(57) ABSTRACT

A magnetic tunnel junction memory cell includes a ferromagnetic reference layer, a ferromagnetic free layer, and a nonmagnetic barrier layer separating the ferromagnetic reference layer from the ferromagnetic free layer. The magnetic tunnel junction cell has an asymmetric energy barrier for switching between a high resistance data state and a low resistance data state. Memory devices and methods are also described.

19 Claims, 3 Drawing Sheets

(56) References Cited

U.S. PATENT DOCUMENTS

| | | |
|---|---|---|
| 6,569,745 B2 | 5/2003 | Hsu |
| 6,584,016 B2 | 6/2003 | Park |
| 6,603,677 B2 | 8/2003 | Redon et al. |
| 6,633,498 B1 | 10/2003 | Engel |
| 6,639,830 B1 | 10/2003 | Heide |
| 6,643,168 B2 | 11/2003 | Okazawa |
| 6,700,753 B2 | 3/2004 | Singleton |
| 6,703,645 B2 | 3/2004 | Ohno |
| 6,711,051 B1 | 3/2004 | Poplevine |
| 6,711,067 B1 | 3/2004 | Kablanian |
| 6,714,444 B2 | 3/2004 | Huai |
| 6,741,492 B2 | 5/2004 | Nii |
| 6,744,086 B2 | 6/2004 | Daughton |
| 6,759,263 B2 | 7/2004 | Ying et al. |
| 6,765,819 B1 | 7/2004 | Bhattacharyya |
| 6,774,391 B1 | 8/2004 | Cowburn |
| 6,781,801 B2 * | 8/2004 | Heinonen et al. .......... 360/324.2 |
| 6,781,867 B2 | 8/2004 | Kurth |
| 6,781,871 B2 | 8/2004 | Park |
| 6,801,415 B2 | 10/2004 | Slaughter et al. |
| 6,818,961 B1 | 11/2004 | Rizzo |
| 6,829,161 B2 | 12/2004 | Huai |
| 6,831,312 B2 | 12/2004 | Slaughter et al. |
| 6,834,005 B1 | 12/2004 | Parkin |
| 6,835,423 B2 | 12/2004 | Chen |
| 6,838,740 B2 | 1/2005 | Huai |
| 6,842,368 B2 | 1/2005 | Hayakawa |
| 6,845,038 B1 | 1/2005 | Shukh |
| 6,847,547 B2 | 1/2005 | Albert |
| 6,850,433 B2 | 2/2005 | Sharma |
| 6,864,551 B2 | 3/2005 | Tsang |
| 6,888,709 B2 | 5/2005 | Princinsky et al. |
| 6,888,742 B1 | 5/2005 | Nguyen |
| 6,909,633 B2 | 6/2005 | Tsang |
| 6,914,807 B2 | 7/2005 | Nakamura |
| 6,920,063 B2 | 7/2005 | Huai |
| 6,930,910 B2 | 8/2005 | Oh |
| 6,933,155 B2 | 8/2005 | Albert |
| 6,943,040 B2 | 9/2005 | Min |
| 6,950,335 B2 | 9/2005 | Dieny |
| 6,958,927 B1 | 10/2005 | Nguyen |
| 6,963,500 B2 | 11/2005 | Tsang |
| 6,965,522 B2 | 11/2005 | Lung |
| 6,967,863 B2 | 11/2005 | Huai |
| 6,979,586 B2 | 12/2005 | Guo |
| 6,985,378 B2 | 1/2006 | Kozicki |
| 6,985,385 B2 | 1/2006 | Nguyen |
| 6,992,359 B2 | 1/2006 | Nguyen |
| 6,998,150 B2 | 2/2006 | Li |
| 7,009,877 B1 | 3/2006 | Huai |
| 7,020,024 B2 | 3/2006 | Sim |
| 7,057,921 B2 | 6/2006 | Valet |
| 7,067,330 B2 | 6/2006 | Min |
| 7,067,866 B2 | 6/2006 | Shi |
| 7,088,609 B2 | 8/2006 | Valet |
| 7,088,624 B2 | 8/2006 | Daniel |
| 7,092,279 B1 | 8/2006 | Sheppard |
| 7,093,347 B2 | 8/2006 | Nowak |
| 7,098,494 B2 | 8/2006 | Pakala |
| 7,098,495 B2 | 8/2006 | Sun |
| 7,099,186 B1 | 8/2006 | Braun |
| 7,105,372 B2 | 9/2006 | Min |
| 7,110,284 B2 | 9/2006 | Hayakawa |
| 7,110,287 B2 | 9/2006 | Huai |
| 7,126,202 B2 | 10/2006 | Huai |
| 7,138,648 B2 | 11/2006 | Kneissl |
| 7,161,829 B2 | 1/2007 | Huai |
| 7,180,113 B2 * | 2/2007 | Braun .......................... 257/295 |
| 7,187,577 B1 | 3/2007 | Wang |
| 7,189,435 B2 | 3/2007 | Tuominen |
| 7,190,611 B2 | 3/2007 | Nguyen |
| 7,196,882 B2 | 3/2007 | Deak |
| 7,224,601 B2 | 5/2007 | Pancula |
| 7,230,265 B2 | 6/2007 | Kaiser |
| 7,230,845 B1 | 6/2007 | Wang |
| 7,233,039 B2 | 6/2007 | Huai |
| 7,241,631 B2 | 7/2007 | Huai |
| 7,241,632 B2 | 7/2007 | Vang |
| 7,242,045 B2 | 7/2007 | Nguyen |
| 7,242,048 B2 | 7/2007 | Huai |
| 7,245,462 B2 | 7/2007 | Huai |
| 7,272,034 B1 | 9/2007 | Chen |
| 7,272,035 B1 | 9/2007 | Chen |
| 7,274,057 B2 | 9/2007 | Worledge |
| 7,282,755 B2 | 10/2007 | Pakala |
| 7,285,836 B2 | 10/2007 | Ju |
| 7,286,395 B2 | 10/2007 | Chen |
| 7,289,356 B2 | 10/2007 | Diao |
| 7,313,043 B2 * | 12/2007 | Gogl et al. ................. 365/210.1 |
| 7,345,912 B2 | 3/2008 | Luo |
| 7,369,427 B2 | 5/2008 | Diao |
| 7,379,280 B2 | 5/2008 | Fukumoto |
| 7,379,327 B2 | 5/2008 | Chen |
| 7,385,842 B2 | 6/2008 | Deak |
| 7,403,418 B2 | 7/2008 | Lin |
| 7,408,806 B2 | 8/2008 | Park |
| 7,411,815 B2 | 8/2008 | Gogl |
| 7,430,135 B2 | 9/2008 | Huai |
| 7,477,491 B2 | 1/2009 | Li |
| 7,480,173 B2 * | 1/2009 | Guo et al. ..................... 365/158 |
| 7,485,503 B2 | 2/2009 | Brask |
| 7,486,551 B1 | 2/2009 | Li |
| 7,486,552 B2 | 2/2009 | Apaklov |
| 7,489,541 B2 | 2/2009 | Pakala |
| 7,495,867 B2 | 2/2009 | Sbiaa |
| 7,502,249 B1 | 3/2009 | Ding |
| 7,508,042 B2 * | 3/2009 | Guo .............................. 257/427 |
| 7,515,457 B2 | 4/2009 | Chen |
| 7,518,835 B2 | 4/2009 | Huai |
| 7,539,047 B2 | 5/2009 | Katti |
| 7,572,645 B2 | 8/2009 | Sun |
| 7,573,736 B2 | 8/2009 | Wang |
| 7,576,956 B2 | 8/2009 | Huai |
| 7,682,841 B2 * | 3/2010 | Dahmani et al. .................. 438/3 |
| 7,728,622 B2 | 6/2010 | Chua-Eoan et al. |
| 7,764,537 B2 | 7/2010 | Jung |
| 7,881,098 B2 * | 2/2011 | Xi et al. ........................ 365/158 |
| 7,935,435 B2 | 5/2011 | Gao |
| 8,058,697 B2 * | 11/2011 | Guo et al. ..................... 257/421 |
| 8,169,810 B2 * | 5/2012 | Zhu et al. ...................... 365/145 |
| 8,197,953 B2 * | 6/2012 | Xi et al. ...................... 428/811.1 |
| 8,217,478 B2 * | 7/2012 | Lou et al. ...................... 257/421 |
| 2003/0011945 A1 | 1/2003 | Yuasa |
| 2003/0137864 A1 | 7/2003 | Holden |
| 2004/0008537 A1 | 1/2004 | Sharma |
| 2004/0084702 A1 | 5/2004 | Jeong |
| 2004/0090809 A1 | 5/2004 | Tran |
| 2004/0170055 A1 | 9/2004 | Albert |
| 2004/0179311 A1 | 9/2004 | Li |
| 2004/0197579 A1 | 10/2004 | Chen |
| 2005/0048674 A1 | 3/2005 | Shi |
| 2005/0068684 A1 | 3/2005 | Gill |
| 2005/0117391 A1 | 6/2005 | Yoda |
| 2005/0139883 A1 | 6/2005 | Sharma |
| 2005/0150535 A1 | 7/2005 | Samavedam |
| 2005/0150537 A1 | 7/2005 | Ghoshal |
| 2005/0184839 A1 | 8/2005 | Nguyen |
| 2005/0185459 A1 | 8/2005 | Fukuzumi |
| 2005/0237787 A1 | 10/2005 | Huai |
| 2005/0254286 A1 | 11/2005 | Valet |
| 2005/0269612 A1 | 12/2005 | Torok |
| 2005/0282379 A1 | 12/2005 | Saito |
| 2006/0049472 A1 | 3/2006 | Diao |
| 2006/0060832 A1 | 3/2006 | Symanczyk |
| 2006/0061919 A1 | 3/2006 | Li |
| 2006/0083047 A1 | 4/2006 | Fujita |
| 2006/0141640 A1 | 6/2006 | Huai |
| 2006/0171199 A1 | 8/2006 | Ju |
| 2006/0233017 A1 | 10/2006 | Hosotani |
| 2006/0245117 A1 | 11/2006 | Nowak |
| 2007/0002504 A1 | 1/2007 | Huai et al. |
| 2007/0007609 A1 | 1/2007 | Saito |
| 2007/0008661 A1 | 1/2007 | Min |
| 2007/0025164 A1 | 2/2007 | Kim |

(56) References Cited

U.S. PATENT DOCUMENTS

| | | |
|---|---|---|
| 2007/0029630 A1 | 2/2007 | Seyyedy |
| 2007/0035890 A1 | 2/2007 | Sbiaa |
| 2007/0047294 A1 | 3/2007 | Panchula |
| 2007/0054450 A1 | 3/2007 | Hong |
| 2007/0063237 A1 | 3/2007 | Huai |
| 2007/0064352 A1 | 3/2007 | Gill |
| 2007/0069314 A1 | 3/2007 | Wilson |
| 2007/0085068 A1 | 4/2007 | Apakov |
| 2007/0096229 A1 | 5/2007 | Yoshikawa |
| 2007/0120210 A1 | 5/2007 | Yuan |
| 2007/0132049 A1 | 6/2007 | Stipe |
| 2007/0164380 A1 | 7/2007 | Min |
| 2007/0171694 A1 | 7/2007 | Huai |
| 2007/0230233 A1 | 10/2007 | Takahashi |
| 2007/0241392 A1 | 10/2007 | Lin |
| 2007/0246787 A1 | 10/2007 | Wang |
| 2007/0279968 A1 | 12/2007 | Luo |
| 2007/0297220 A1 | 12/2007 | Yoshikawa |
| 2007/0297223 A1 | 12/2007 | Chen |
| 2008/0026253 A1 | 1/2008 | Yuasa |
| 2008/0055792 A1 | 3/2008 | Zheng |
| 2008/0061388 A1 | 3/2008 | Diao |
| 2008/0130354 A1 | 6/2008 | Ho |
| 2008/0179699 A1 | 7/2008 | Horng |
| 2008/0180991 A1 | 7/2008 | Wang |
| 2008/0191251 A1 | 8/2008 | Ranjan |
| 2008/0205121 A1 | 8/2008 | Chen |
| 2008/0258247 A1 | 10/2008 | Mancoff |
| 2008/0265347 A1 | 10/2008 | Iwayama |
| 2008/0273380 A1 | 11/2008 | Diao |
| 2008/0277703 A1 | 11/2008 | Iwayama |
| 2008/0291721 A1 | 11/2008 | Apalkov |
| 2008/0310213 A1 | 12/2008 | Chen |
| 2008/0310219 A1 | 12/2008 | Chen |
| 2009/0027810 A1 | 1/2009 | Horng |
| 2009/0040855 A1 | 2/2009 | Luo |
| 2009/0050991 A1 | 2/2009 | Nagai |
| 2009/0073756 A1 | 3/2009 | Yang |
| 2009/0185410 A1 | 7/2009 | Huai |
| 2009/0218645 A1 | 9/2009 | Ranjan |
| 2009/0257154 A1 | 10/2009 | Carey |
| 2009/0296454 A1 | 12/2009 | Honda |
| 2009/0302403 A1 | 12/2009 | Nguyen |
| 2010/0034009 A1 | 2/2010 | Lu |
| 2010/0118600 A1 | 5/2010 | Nagase |
| 2010/0176471 A1 | 7/2010 | Zhu |

OTHER PUBLICATIONS

Berger, Emission of Spin Waves by Magnetic Multilayer Traversed by a Current, Physic. Review B 54, 9353 (1996).
Black et al., Programmable Logic Using Giant Magnetoresistance and Spin-Dependent Tunneling Devices (Invited), J. Appl. Phys. 87, 6674 (2000).
Chu et al., Fabrication of Ideally Ordered Nanoporous Alumina Films and Integrated Alumina Nanotubule Arrays by High-Field Anodization, Adv. Mater. 2005, 17, 2115-2119.
Cowburn et al., Room Temperature Magnetic Quantum Cellular Automata, Science 287, 1466 (2000).
de Groot et al., New Class of Materials: Half-Metallic Ferromagnets, Physics Review Letters, 50, 2024 (1983).
Egelhoff et al., Oxygen as a Surfactant in the Growth of Giant Magnetoresistance Spin Valves, Journal of Applied Physics 82 (12), Dec. 15 1997.
Emley, N.C., et al., Reduction of Spin Transfer by Synthetic Antiferromagnets, Applied Physics Letters, May 24, 2004, pp. 4257-4259, vol. 84, No. 21.
Folk et al., A Gate-Controlled Bidirectional Spin Filter Using Quantum Coherence, Science, vol. 299, Jan. 31, 2003, pp. 679-682.
Huczko, Template-Based Synthesis of Nanomaterials, Appl. Phys. A 70, 365-376 (2000).
Kawahara et al., 2Mb Spin-Transfer Torque RAM (SPRAM) with Bit-by-Bit Bidirectional Current Write and Parallelizing-Direction Current Read, ISSCC 2007, Section 26, Non-Volatile Memories/26.5.
Korenivski, et al., Thermally Activated Switching in Spin-Flop Tunnel Junctions, Applied Physics Letters 86, 252506 (2005).
Li et al., Role of Oxygen Exposure in Different Positions in the Synthetic Spin Valves, Journal of Applied Physics, vol. 93, No. 10, May 15 2003.
Macak et al., High-Aspect-Ratio TiO2, Nanotubes by Anodization of Titanium, Angew. Chem. Int. Ed. 2005, 44, 2100-2102.
Masuda and Kenji Fukuda, Science, 268, 1466 91995).
Masuda et al., Ordered Metal Nanohole Arrays Made by a Two-Step Replication of Honeycomb Structures of Anodic Alumina, Science, OI. 268, Jun. 9, 1995.
Meng et al., A Spintronics Full Adder for Magnetic CPU, IEEE Elec. Dev. Lett. 26, 360 (2005).
Meng et al., Spin Transfer in Nanomagnetic Devices with Perpendicular Anistropy, Applied Physics Letters 88, 172506 (2006).
Miura et al., A Novel SPRAM (Spin Transfer Torque RAM) with a Synthetic Ferrimagnetic Free Layer . . . , VLSI Symposium on VLSI Tech. Digest of Technical Papers (2007).
Ney et al., Programmable Computing with a Single Magnetoresistance Element, Nature 425, 485 (2003).
PCT Search Report and Written Opinion dated Oct. 4, 2010, Our Ref: 15010WO00.
PCT Search Report and Written Opinion dated Mar. 10, 2010, Our Ref: 13835WO00.
PCT Search Report and Written Opinion dated Mar. 22, 2010, Our Ref: 14647WO00.
Prejbeanu et al., Thermally Assisted MRAM, J. Phys. Condens. Matter 19 (2007) 165218 (23 pp).
Seki et al., Spin-Polarized Current-Induced Magnetization Reversal in Perpendicularly Magnetized L1o-FePt Layers, Applied Physics Letters 88, 172504 (2006).
Slonczewski et al., Current-Driven Excitation of Magnetic Multilayers, Journal of Magnetism and Magnetic Materials 159 (1996) L1-L7.
Sun, "Spin-Current Interaction with a Monodomain Magnetic Body: A Model Study", Physical Review B, vol. 62, No. 1, (2000), pp. 570-578.
Thurn-Albrecht et al., Science, 290, 2126 (2000).
U.S. Appl. No. 12/416,976, filed Apr. 2, 2009, Inventor: Zheng, Our Ref: 14630.
U.S. Appl. No. 12/106,382, filed Apr. 21, 2008, Inventors: Xi et al.
U.S. Appl. No. 12/125,975, filed May 23, 2008, Inventor: Xi, Our Ref: 13866.00.
U.S. Appl. No. 12/126,014, filed May 23, 2008, Inventor: Xiaohua Lou, Our Ref: 14204.00.
U.S. Appl. No. 12/170,519, filed Jul. 10, 2008, Inventors: Xi et al.
U.S. Appl. No. 12/175,545, filed Jul. 18, 2008, Inventor: Lou.
U.S. Appl. No. 12/239,882, filed Sep. 29, 2008, Inventor: Zheng et al.
U.S. Appl. No. 12/239,887, filed Sep. 29, 2008; Inventor: Zheng, Our Ref: 1011.14596.00.
U.S. Appl. No. 12/258,476, filed Oct. 27, 2008, Inventor: Lou.
U.S. Appl. No. 12/258,491, filed Oct. 27, 2008, Inventor: Lou.
U.S. Appl. No. 12/258,492, filed Oct. 27, 2008, Inventor: Lou.
U.S. Appl. No. 12/269,507, filed Nov. 12, 2008, Inventor: Tian.
U.S. Appl. No. 12/269,514, filed Nov. 12, 2008, Inventor: Venkatasamy.
U.S. Appl. No. 12/269,537, filed Nov. 12, 2008, Inventor: Tang et al.
U.S. Appl. No. 12/396,905, filed Mar. 3, 2009, Inventor: Gao, Our Ref: 14689.
U.S. Appl. No. 12/398,214, filed Mar. 5, 2009, Inventor: Wang et al.
U.S. Appl. No. 12/425,457, filed Apr. 17, 2009, Inventor: Gao (14787).
Vurgaftman et al., Spin-Polarizing Properties of the InAs/(AlSb)/GaMnSb/(AlSb/InAs Ferromagnetic Resonant Interband Tunneling Diode, Physical Review B 67, 12509 (2003).
Wendt et al., Electronic and Vibrational Properties of Ultrathin SiO2 Films Grown on Mo(112), 2005, Phys. Rev. vol. B72, pp. 1150409-1-115409.0.
Yan et al., Magnesium Oxide as a Candidate High-k Gate Dielelectric, 2006, Applied Physics Lett. vol. 88, pp. 142901-1-142901-3.

(56) References Cited

OTHER PUBLICATIONS

Zheng et al., Low Switching Current Flux-Closed Magnetoresistive Random Access Memory, Journal of Applied Physics, May 15, 2003.
Zheng et al., Magnetic Random Access Memory (MRAM), Journal of Nanoscience and Nanotechnology, vol. 7, 117-137 (2007).
Zhuang et al., Tech Dig. IEDM (2002) 193.
Sun, Spin-Current Interaction with a Monodomain Magnetic Body: A Model Study, Physical Review B, vol. 62, No. 1, Jul. 1, 2000.
Sharrock, Time Dependence of Switching Fields in Magnetic Recording Media (Invited), J. Appl. Phys. 76 (10), Nov. 15, 1994.
Hayakawa et al., Current-Induced Magnetization Switching in MgO Barrier Based Magnetic Tunnel Junctions with CoFeB/Ru/CoFeB Synthetic Ferrimagnetic Free layer, Japanese Journal of Applied Physics, vol. 45, No. 40, 2006, pp. L1057-1060.
Yen et al., Reduction in Critical Current Density for Spin Torque Transfer Switching with Composite Free Layer, Applied Physics Letters 93, 092504 (2008).

\* cited by examiner

MAGNETIC MEMORY WITH ASYMMETRIC ENERGY BARRIER

RELATED APPLICATIONS

This application is a continuation of U.S. patent application Ser. No. 12/497,953, filed Jul. 6, 2009, now U.S. Pat. No. 8,169,810 and which claims priority to U.S. provisional patent application No. 61/103,742, filed Oct. 8, 2008. The entire disclosures of both applications are incorporated herein by reference.

BACKGROUND

Spin torque transfer technology, also referred to as spin electronics, combines semiconductor technology and magnetics, and is a more recent development. In spin electronics, the spin of an electron, rather than the charge, is used to indicate the presence of digital information. The digital information or data, represented as a "0" or "1", is storable in the alignment of magnetic moments within a magnetic element. The resistance of the magnetic element depends on the moment's alignment or orientation. The stored state is read from the element by detecting the component's resistive state.

The magnetic element, in general, includes a ferromagnetic pinned layer and a ferromagnetic free layer, each having a magnetization orientation that defines the resistance of the overall magnetic element. Such an element is generally referred to as a "spin tunneling junction," "magnetic tunnel junction", "magnetic tunnel junction cell", and the like. When the magnetization orientations of the free layer and pinned layer are parallel, the resistance of the element is low. When the magnetization orientations of the free layer and the pinned layer are antiparallel, the resistance of the element is high.

Application of spin torque transfer memory has a switching current density requirement generally at $10^6$ to $10^7$ A/cm$^2$, which leads to difficulty in integrating with a regular CMOS process. It is desirable to reduce the switching current density significantly in order to make a feasible product.

However, there is a dilemma between switching current and data stability in spin torque transfer cells. A low switching current can reduce data retention due to thermal instability of the spin torque transfer cells. Spin torque transfer cell design that can achieve both low switching current with sufficient data retention is desired.

BRIEF SUMMARY

The present disclosure relates to magnetic tunnel junction cells that have an asymmetric energy barrier for switching between a high resistance data state and a low resistance data state. The magnetic tunnel junction cell structures described below are stable and have low switching current requirements. The magnetic memory unit, which includes the magnetic tunnel junction cell, can be utilized in a memory array.

In one embodiment, this disclosure describes a magnetic tunnel junction cell having a ferromagnetic reference layer, a ferromagnetic free layer, and a non-magnetic barrier layer separating the ferromagnetic reference layer from the ferromagnetic free layer. The magnetic tunnel junction cell has an asymmetric energy barrier for switching between a high resistance data state and a low resistance data state. Memory devices and methods are also described.

Additional embodiments of magnetic tunnel junction cells and memory devices are disclosed, as well methods of making and using the cells. These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

This disclosure is directed to spin-transfer torque memory, also referred to as spin torque memory, spin torque RAM, or STRAM, and the magnetic tunnel junction cells (MTJs) that are a part of the memory. The spin magnetic tunnel junction cells (MTJs) of this disclosure utilize an asymmetric energy barrier can reduce the switching current while maintaining data retention. In particular this disclosure is directed to spin-transfer torque memory that includes a stabilization element of at least two ferromagnetic layers separated by a nonmagnetic spacer layer. The two ferromagnetic layers have antiparallel magnetization orientations and the ferromagnetic layer closer to the ferromagnetic free layer has a parallel magnetization orientation to the magnetization orientation of the free layer. While the present disclosure is not so limited, an appreciation of various aspects of the disclosure will be gained through a discussion of the examples provided below.

In the following description, reference is made to the accompanying set of drawings that forms a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions and descriptions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the specification and attached claims are approximations that can vary depending upon the desired properties sought to be obtained by those skilled in the art utilizing the teachings disclosed herein.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

While the present disclosure is not so limited, an appreciation of various aspects of the disclosure and of the invention will be gained through a discussion of the Figures and the examples provided below.

Figure 1A:
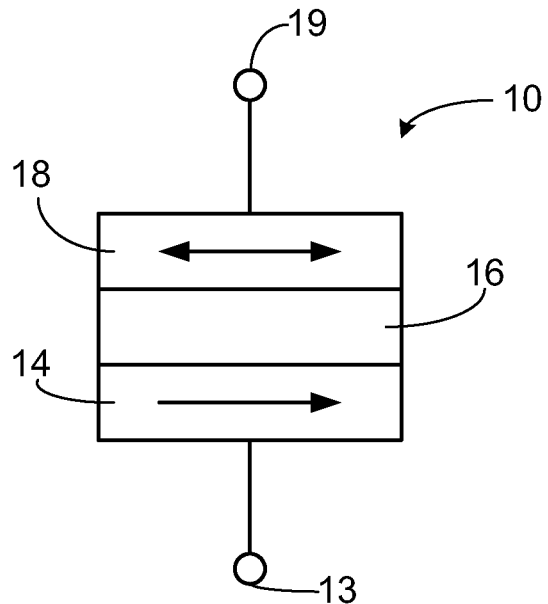
FIG. 1A is a cross-sectional schematic diagram of an illustrative magnetic tunnel junction cell.

FIG. 1A is a cross-sectional schematic diagram of an illustrative magnetic tunnel junction cell 10. The magnetic tunnel junction cell 10 includes a ferromagnetic reference layer or element 14, a ferromagnetic free element or layer 18 and a tunneling barrier 16 separating the ferromagnetic reference magnetic element 14 from the ferromagnetic free element 18. These elements or layers are disposed electrically between a first electrode 13 and a second electrode 19. While a single magnetic tunnel junction cell 10 is shown, it is understood that a plurality of magnetic tunnel junction cell 10 can be arranged in an array to form a memory array. Other layers, such as seed or capping layers, are not depicted for clarity.

While the ferromagnetic reference element 14 is illustrated as a single layer, it is understood that this element 14 can include two or more layer such as, a ferromagnetic reference (pinned) layer and a antiferromagnetic reference (pinning) layer, where the antiferromagnetic reference layer serves to fix the magnetization of the ferromagnetic reference layer. In other embodiments, the ferromagnetic reference element 14 includes more than one ferromagnetic layer that are coupled anti-ferromagnetically to each other (e.g., synthetic antiferromagnet). The ferromagnetic reference layer can be formed of any useful material such as, for example, alloys and materials including Co, Fe, and/or Ni. Ternary alloys, such as CoFeB, may be particularly useful because of their lower moment and high polarization ratio, which are desirable for the spin-current switching. The antiferromagnetic reference layer can be formed of any useful material such as, for example, IrMn, FeMn, and/or PtMn.

The ferromagnetic free element 18 can be formed of any useful soft magnetic material that allows a magnetization orientation of the ferromagnetic free element 18 to switch between a first magnetization orientation and an opposing second magnetization orientation. The first magnetization orientation can be parallel with a magnetization orientation of the ferromagnetic reference element 14, forming a low resistance data state or a "0" data state. The second magnetization orientation can be anti-parallel with a magnetization orientation of the ferromagnetic reference element 14, forming a high resistance data state or a "1" data state. The ferromagnetic free layer can be formed of any useful material such as, for example, alloys and materials including Co, Fe, and/or Ni. Ternary alloys, such as CoFeB, may be particularly useful because of their lower moment and high polarization ratio, which are desirable for the spin-current switching.

The tunneling barrier 16 is an electrically insulating and non-magnetic material. The tunneling barrier 16 can be formed of any useful electrically insulating and non-magnetic material such as, AlO, MgO, and/or TiO, for example.

Electrodes 13, 19 electrically connect the magnetic tunnel junction cell 10 to a control circuit providing read and write currents through the magnetic tunnel junction cell 10. Resistance across the magnetic tunnel junction cell 10 is determined by the relative orientation of the magnetization vectors or magnetization orientations of ferromagnetic layers 14, 18. The magnetization direction of ferromagnetic reference or pinned layer 14 is pinned in a predetermined direction while the magnetization direction of ferromagnetic free layer 18 is free to rotate under the influence of spin torque.

Switching the resistance state and hence the data state of magnetic tunnel junction cell 10 via spin-torque transfer occurs when a current, passing through a magnetic layer of magnetic tunnel junction cell 10, becomes spin polarized and imparts a spin torque on the ferromagnetic free layer 18 of magnetic tunnel junction cell 10. When a sufficient spin torque is applied (sufficient to overcome the energy barrier E) to ferromagnetic free layer 18, the magnetization orientation of the ferromagnetic free layer 18 can be switched between two opposite directions and accordingly, magnetic tunnel junction cell 10 can be switched between the parallel state (i.e., low resistance state or "0" data state) and anti-parallel state (i.e., high resistance state or "1" data state).

Figure 1B:
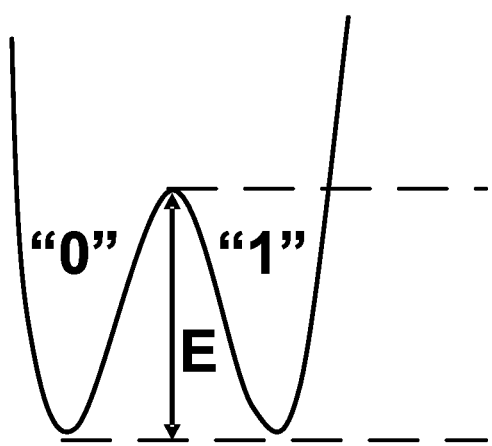
FIG. 1B is an energy barrier graph for the two data states of the magnetic tunnel junction cell shown in FIG. 1A.

FIG. 1B is an energy barrier graph for the two data states of the magnetic tunnel junction cell 10 shown in FIG. 1A. The energy barrier E is the same value when switching from the "0" state to the "1" state and from the "1" state to the "0" state. This energy barrier profile is termed a symmetric energy barrier E for switching between the high resistance data state or "1" data state and the low resistance data state or "0" data state. The symmetric energy barrier E is a value that is great enough to provide data state retention of a specified value at a specified temperature, such as data state retention for at least one year at 85 degrees centigrade, for example. One useful energy barrier value that can achieve this performance is an energy barrier value of 45 (unitless when expressed in terms of KuV/kbT). Thus, energy of at least 45 is required to switch from the "0" state to the "1" state and from the "1" state to the "0" state. Achieving this energy requires a relatively large switching current to pass through the magnetic tunnel junction cell. However, utilizing an asymmetric energy barrier, to switch from the "0" state to the "1" state and then from the "1" state to the "0" state, has been found to reduce the switching current while maintaining the required data retention properties.

Figure 2A:
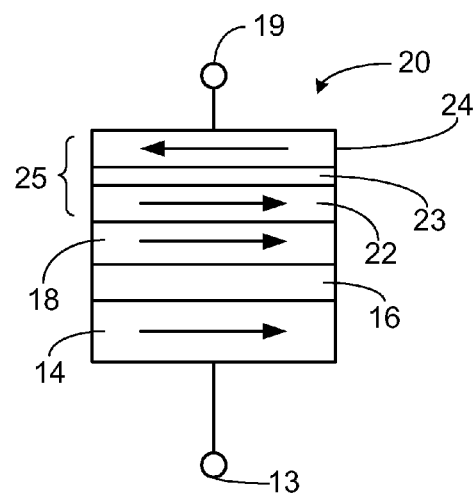
FIG. 2A is a cross-sectional schematic diagram of an illustrative magnetic tunnel junction cell with a stabilization element in a low resistance state.
Figure 3A:
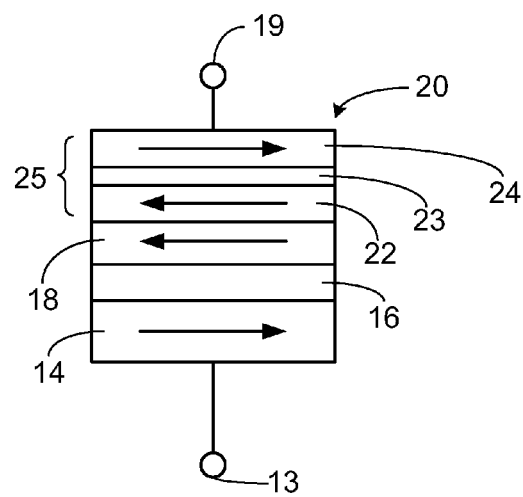
FIG. 3A is a cross-sectional schematic diagram of an illustrative magnetic tunnel junction cell with a stabilization element in a high resistance state.
Figure 2B:
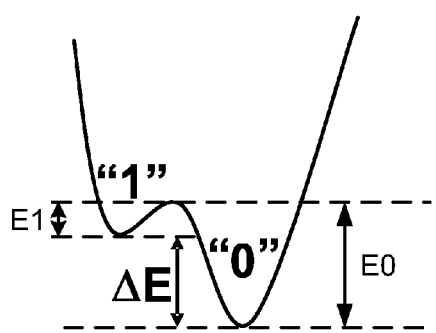
FIG. 2B is an energy barrier graph for the two data states of the magnetic tunnel junction cell shown in FIG. 2A.
Figure 3B:
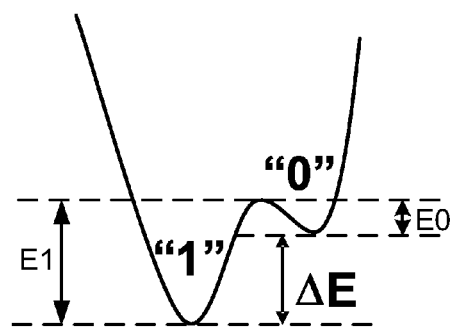
FIG. 3B is an energy barrier graph for the two data states of the magnetic tunnel junction cell shown in FIG. 3A.

FIG. 2A is a cross-sectional schematic diagram of an illustrative magnetic tunnel junction cell 20 with a stabilization element in a low resistance state or "0" data state (parallel magnetizations of reference and free layers). FIG. 2B is an energy barrier graph for the two data states of the magnetic tunnel junction cell 20 shown in FIG. 2A. FIG. 3A is a cross-sectional schematic diagram of an illustrative magnetic tunnel junction cell 20 with a stabilization element in a high resistance state or "1" data state (anti-parallel magnetizations of reference and free layers). FIG. 3B is an energy barrier graph for the two data states of the magnetic tunnel junction cell 20 shown in FIG. 3A.

Referring to FIG. 2A and FIG. 3A, the magnetic tunnel junction cell 20 includes a ferromagnetic reference layer or element 14 (described above), a ferromagnetic free element or layer 18 (described above) and a tunneling barrier 16 (described above) separating the ferromagnetic reference magnetic element 14 from the ferromagnetic free element 18. These elements or layers are disposed electrically between a first electrode 13 and a second electrode 19. While a single magnetic tunnel junction cell 10 is shown, it is understood that a plurality of magnetic tunnel junction cell 10 can be arranged in an array to form a memory array. The magnetic tunnel junction cell 20 has an asymmetric energy barrier for switching between a high resistance data state and a low resistance data state. In many embodiments the asymmetric energy barrier is achieved with a stabilization layer 25. The stabilization layer 25 is disposed adjacent to or on the ferromagnetic free element or layer 18.

The stabilization layer 25 includes a first ferromagnetic layer 24 and a second ferromagnetic layer 22 separated by a nonmagnetic depolarizing layer 23. In some embodiments (not illustrated) a non-magnetic spacer layer separates the stabilization layer 25 from the ferromagnetic free element or layer 18. The ferromagnetic layers 22, 24 can be formed of any useful material such as, for example, alloys and materials including Co, Fe, and/or Ni.

The first and second ferromagnetic layers 24, 22 have opposing magnetization orientations and the second ferromagnetic layer 22 has a magnetic orientation that is parallel with a magnetization orientation of the ferromagnetic free layer 18. In many embodiments the first and second ferromagnetic layers 24, 22 are antiferromagnetically coupled and the second ferromagnetic layer 22 has a magnetic orientation that is magnetostatically coupled to a magnetization orientation of the ferromagnetic free layer 18. Antiferromagnetic coupling between the first and second ferromagnetic layers 24, 22 is achieved by exchange coupling and magnetostatic coupling.

A coercivity of the first ferromagnetic layer 24 is smaller than the coupling to the second ferromagnetic layer 22 and the second ferromagnetic layer 22 strongly couples to the ferromagnetic free layer 18. Inclusion of the stabilization layer 25 allows the ferromagnetic free layer 18 to have a thickness of less than 10 nanometers. This thin ferromagnetic free layer 18 has a low energy barrier E so it is easy to switch. The stabilization layer 25 has a high energy barrier so it is thermally stable and makes the ferromagnetic free layer 18 prefer one direction through exchange coupling, or magnetostatic coupling, for example.

The asymmetric energy barrier is illustrated in FIG. 2B for the "0" data state and in FIG. 3B for the "1" data state. In FIG. 2B the energy barrier to switch to the "0" data state is E1 and the energy barrier to switch to the "1" data state is E0 and ΔE is the energy barrier different between E1 and E0. Here, E0 is greater than E1. In many embodiments E0 is 10% greater than, or 25% greater than, or 30% greater than E1. In FIG. 3B the energy barrier to switch to the "0" data state is E1 and the energy barrier to switch to the "1" data state is E0 and ΔE is the energy barrier different between E1 and E0. Here, E1 is greater than E0. In many embodiments E1 is 10% greater than, or 25% greater than, or 30% greater than E0. In one particular embodiment, E1 has a value of 15 and E0 has a value of 32.2 thus ΔE is 17.2, and this embodiment possessed similar data retention properties as the symmetric energy barrier example described above where the energy barrier was 45. Thus, this embodiment possessed both data retention and a lower energy barrier (i.e., a lower switching current).

Figure 4A:
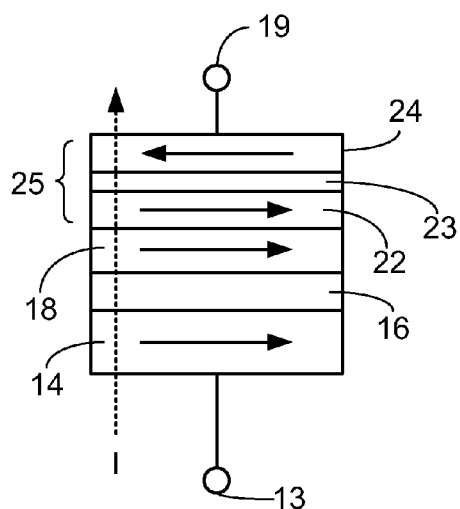
FIGS. 4A-4D are cross-sectional schematic diagram of an illustrative magnetic tunnel junction cell with a stabilization element switching from a low resistance state to a high resistance state.
Figure 4B:
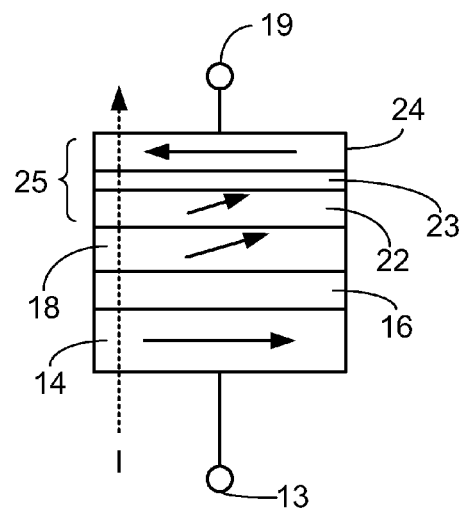
Figure 4C:
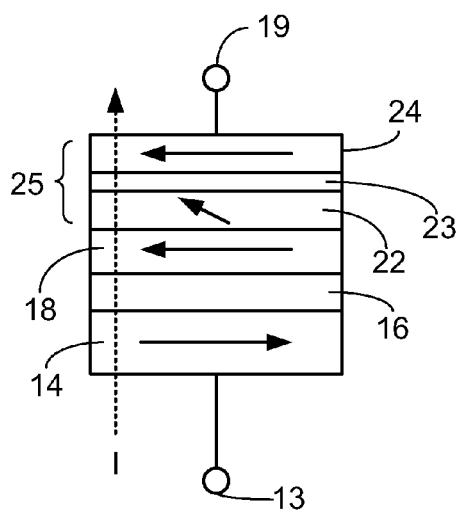
Figure 4D:
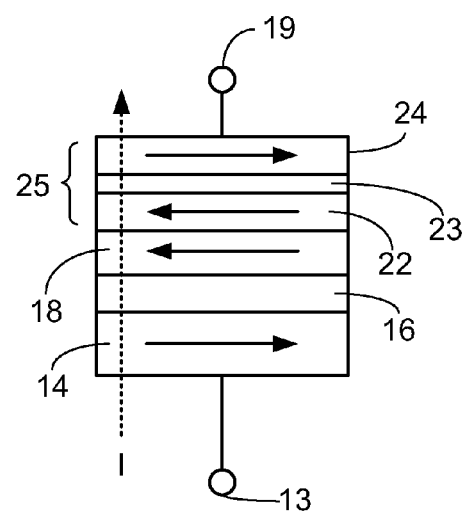

FIGS. 4A-4D are cross-sectional schematic diagrams of an illustrative magnetic tunnel junction cell with a stabilization element switching from a low resistance state to a high resistance state. The elements forming the magnetic tunnel junction cell are described above with relation to FIG. 2A and FIG. 3A. FIG. 4A illustrates the magnetic tunnel junction cell in an initial low resistance data state. A current I is applied through the magnetic tunnel junction cell. FIG. 4B illustrates initial switching of the ferromagnetic free layer 18 and that the magnetization orientation of the second ferromagnetic layer 22 is exchange coupled to the magnetization orientation of the ferromagnetic free layer 18, thus both layers function like a composite free layer, however the ferromagnetic free layer 18 can complete its rotation faster than the second ferromagnetic layer 22 as the ferromagnetic free layer 18 can be much thinner than the second ferromagnetic layer 22. FIG. 4C illustrates completion of the switching of the ferromagnetic free layer 18 from the parallel to the anti-parallel orientation relative to the magnetization orientation of the ferromagnetic reference layer 14. The second ferromagnetic layer 22 is exchange coupled to the magnetization orientation of the ferromagnetic free layer 18 and also switches from the parallel to the anti-parallel orientation relative to the magnetization orientation of the ferromagnetic reference layer 14. FIG. 4D illustrates the completion of the switching from a low resistance state to a high resistance state where once the second ferromagnetic layer 22 completes its rotation, the first ferromagnetic layer 24 switches to an anti-parallel magnetization orientation due to antiferromagnetic coupling between the first ferromagnetic layer 24 and the second ferromagnetic layer 22. When the current I is absent, the energy barrier of the ferromagnetic free layer 18 is asymmetric and the ferromagnetic free layer 18 prefers to keep its written to state due to the exchange field from the second ferromagnetic layer 22, and the antiferromagnetic coupling between the first ferromagnetic layer 24 and the second ferromagnetic layer 22.

Thus, embodiments of the MAGNETIC MEMORY WITH ASYMMETRIC ENERGY BARRIER are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A magnetic memory cell comprising:
    a ferromagnetic reference layer;
    a ferromagnetic free layer; and
    a non-magnetic barrier layer separating the ferromagnetic reference layer from the ferromagnetic free layer, the magnetic memory cell having an asymmetric energy barrier for switching between a high resistance data state and a low resistance data state.

2. The magnetic memory cell of claim 1, wherein the magnetic memory cell has a first energy barrier value to switch from the high resistance data state to the low resistance data state and a second energy barrier value to switch from the low resistance data state to the high resistance data state and the first energy barrier value is at least 25% different than the second energy barrier.

3. The magnetic memory cell of claim 1, further comprising a stabilization element disposed on the ferromagnetic free layer, the stabilization layer comprising a first ferromagnetic layer and a second ferromagnetic layer separated by a non-magnetic depolarizing layer.

4. The magnetic memory cell of claim 3, wherein the first and second ferromagnetic layers have opposing magnetization orientations and the second ferromagnetic layer has a magnetic orientation that is parallel with a magnetization orientation of the free layer.

5. The magnetic memory cell of claim 3, wherein the first and second ferromagnetic layers are antiferromagnetically coupled and the second ferromagnetic layer has a magnetic orientation that is magnetostatically coupled to a magnetization orientation of the free layer.

6. The magnetic tunnel junction cell of claim 3, wherein a coercivity of the first ferromagnetic layer is smaller than the coupling to the second ferromagnetic layer.

7. The magnetic tunnel junction cell of claim 3, wherein the magnetic memory cell switches between the high resistance data state and the low resistance data state by passing a spin-polarized current through the ferromagnetic free layer.

8. The magnetic memory cell of claim 1, wherein the ferromagnetic free layer has a thickness of less than 10 nanometers.

9. The magnetic memory cell of claim 1, wherein a coercivity of the first ferromagnetic layer is smaller than the coupling to the second ferromagnetic layer.

10. A magnetic memory cell comprising:
a ferromagnetic reference layer having a pinned magnetization orientation;
a ferromagnetic free layer having a free magnetization orientation that is switchable between a first magnetization orientation and an opposing second magnetization orientation;
a non-magnetic barrier layer separating the ferromagnetic reference layer from the ferromagnetic free layer; and
a stabilization element disposed on the ferromagnetic free layer, the stabilization layer comprising two ferromagnetic layers separated by a nonmagnetic depolarizing layer, and the two ferromagnetic layers have opposing magnetization orientations and one of the ferromagnetic layers has a magnetic orientation that is parallel with the free magnetization orientation of the ferromagnetic free layer.

11. The magnetic memory cell of claim 10, wherein the two ferromagnetic layers are antiferromagnetically coupled and one of the ferromagnetic layers is magnetostatically coupled to the ferromagnetic free layer.

12. The magnetic memory cell of claim 10, wherein the magnetic tunnel junction cell having an asymmetric energy barrier for switching between a high resistance data state and a low resistance data state.

13. The magnetic memory cell of claim 10, wherein the magnetic memory cell has a first energy barrier value to switch from a high resistance data state to a low resistance data state and a second energy barrier value to switch from the low resistance data state to the high resistance data state and the first energy barrier value is at least 25% different than the second energy barrier.

14. The magnetic memory cell of claim 10, wherein the magnetic memory cell switches between a high resistance data state and a low resistance data state by passing a spin-polarized current through the ferromagnetic free layer.

15. The magnetic memory cell of claim 10, wherein the ferromagnetic free layer has a thickness of less than 10 nanometers.

16. A magnetic memory cell comprising:
a ferromagnetic reference layer having a pinned magnetization orientation;
a ferromagnetic free layer having a free magnetization orientation that is switchable between a high resistant data state magnetization orientation and a low resistance data state magnetization orientation upon passing a spin-polarized current through the ferromagnetic free layer;
a non-magnetic barrier layer separating the ferromagnetic reference layer from the ferromagnetic free layer; and
a stabilization element disposed on the ferromagnetic free layer, the stabilization layer comprising two ferromagnetic layers separated by a nonmagnetic depolarizing layer, and the two ferromagnetic layers have opposing magnetization orientations and one of the ferromagnetic layers has a magnetic orientation that is parallel with the free magnetization orientation of the ferromagnetic free layer, and the magnetic memory cell having an asymmetric energy barrier for switching between the high resistance data state and the low resistance data state.

17. The magnetic memory cell of claim 16, wherein the two ferromagnetic layers are antiferromagnetically coupled and one of the ferromagnetic layers is magnetostatically coupled to the ferromagnetic free layer.

18. The magnetic memory cell of claim 16, wherein the magnetic memory cell has a first energy barrier value to switch from a high resistance data state to a low resistance data state and a second energy barrier value to switch from the low resistance data state to the high resistance data state and the first energy barrier value is at least 25% different than the second energy barrier.

19. The magnetic memory cell of claim 16, wherein a coercivity of the first ferromagnetic layer is smaller than the coupling to the second ferromagnetic layer.

* * * * *